(12) United States Patent
Yamamoto et al.

(10) Patent No.: US 8,901,804 B2
(45) Date of Patent: *Dec. 2, 2014

(54) ORGANIC EL ILLUMINATION DEVICE AND METHOD FOR MANUFACTURING THE SAME

(75) Inventors: Emi Yamamoto, Osaka (JP); Hidenori Ogata, Osaka (JP); Yoshimasa Fujita, Osaka (JP); Makoto Yamada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 245 days.

This patent is subject to a terminal disclaimer.

(21) Appl. No.: 13/497,244

(22) PCT Filed: Jun. 21, 2010

(86) PCT No.: PCT/JP2010/004120
§ 371 (c)(1),
(2), (4) Date: Mar. 20, 2012

(87) PCT Pub. No.: WO2011/039911
PCT Pub. Date: Apr. 7, 2011

(65) Prior Publication Data
US 2012/0181915 A1  Jul. 19, 2012

(30) Foreign Application Priority Data
Oct. 2, 2009 (JP) .................. 2009-230860

(51) Int. Cl.
*H05B 33/20* (2006.01)
*H01J 9/00* (2006.01)
*H01L 51/52* (2006.01)

(52) U.S. Cl.
CPC .......... *H01L 51/529* (2013.01); *H01L 51/5237* (2013.01)

USPC .............. 313/46; 313/504; 313/113; 445/23; 445/25

(58) Field of Classification Search
CPC .................. H01L 2924/00; H01L 2224/48091; H01L 2224/73265; H01L 33/60; H01L 33/08; H01L 33/46; H01L 33/64; H01L 51/5271
USPC .................. 313/46, 113, 114, 116, 503–506; 362/126, 294, 547, 218, 264, 345, 373, 362/580

See application file for complete search history.

(56) References Cited

U.S. PATENT DOCUMENTS

2002/0105267 A1  8/2002  Mochizuki et al.
2006/0261337 A1  11/2006  Koma (Continued)

FOREIGN PATENT DOCUMENTS

JP  4-181690 A  6/1992
JP  10-275681 A  10/1998

(Continued)

OTHER PUBLICATIONS

Tang et al., "Organic Electroluminescent Diodes", Applied Physics Letters, vol. 51, No. 12, Sep. 21, 1987, pp. 913-915.

(Continued)

*Primary Examiner* — Ashok Patel
(74) *Attorney, Agent, or Firm* — Morrison & Foerster LLP

(57) ABSTRACT

In an organic EL illumination device (1), a plurality of organic EL elements (4) are provided between an element substrate (30) and a covering substrate (20). A heat dissipation member (14) which covers surfaces of the organic EL elements (4) is provided in a space formed between the element substrate (30) and the covering substrate (20), between each organic EL element (4).

15 Claims, 6 Drawing Sheets

(56) References Cited

U.S. PATENT DOCUMENTS

| | | |
|---|---|---|
| 2006/0262242 A1 | 11/2006 | Koma |
| 2008/0093978 A1 | 4/2008 | Mori |
| 2009/0095960 A1* | 4/2009 | Murayama ............ 257/79 |
| 2009/0114905 A1* | 5/2009 | Ottermann et al. ........ 257/40 |
| 2010/0065863 A1* | 3/2010 | Ray et al. ............ 257/88 |
| 2012/0126218 A1* | 5/2012 | Ogata et al. ........... 257/40 |

FOREIGN PATENT DOCUMENTS

| | | |
|---|---|---|
| JP | 2002-260844 A | 9/2002 |
| JP | 2003-77649 A | 3/2003 |
| JP | 2004-227929 A | 8/2004 |
| JP | 2005-149853 A | 6/2005 |
| JP | 2006-128022 A | 5/2006 |
| JP | 2006-324199 A | 11/2006 |
| JP | 2007-17720 A | 1/2007 |
| JP | 2008-108439 A | 5/2008 |
| JP | 2011-76844 A | 4/2011 |

OTHER PUBLICATIONS

International Search Report received for PCT Patent Application No. PCT/JP2010/004120, mailed on Jul. 27, 2010, 5 pages (3 pages of English Translation and 2 pages of PCT Search Reoprt).

* cited by examiner (a)

(b)

(c)

(d)

(e)

ORGANIC EL ILLUMINATION DEVICE AND METHOD FOR MANUFACTURING THE SAME

CROSS REFERENCE TO RELATED APPLICATIONS

This is a U.S. National Phase patent application of PCT/JP2010/004120, filed Jun. 21, 2010, which claims priority to Japanese Patent Application No. 2009-230860, filed Oct. 2, 2009, each of which is hereby incorporated by reference in the present disclosure in its entirety.

TECHNICAL FIELD

The present invention relates to organic electroluminescence (hereinafter referred to as "organic EL") illumination devices and methods for manufacturing organic EL illumination devices.

BACKGROUND ART

In recent years, as information technology has been advanced, there has been an increasing demand for flat panel displays. Examples of known flat panel displays include a non-light emitting type liquid crystal display (LCD), a light emitting type plasma display (PDP), an inorganic electroluminescence (inorganic EL) display, an organic EL display, etc. Among these flat panel displays, there has been particularly a significant advance in the organic EL display.

An organic EL element, which has received attention as a next-generation light emitting element, includes at least an emitting layer made of an organic material between a pair of electrodes, and further optionally includes a charge injecting layer for injecting electronic charge into the emitting layer and a charge transporting layer for transporting electronic charge from the electrode to the organic layer. The organic EL element can have a thinner thickness and a lighter weight, and has properties, such as low voltage drive, high luminance, light emission, etc., and therefore, is currently extensively studied and developed.

The organic EL element is expected to be applied not only to displays, but also to light sources for electrophotographic copiers, printers, etc., and illumination. Organic EL illumination devices including the organic EL element for illumination have many advantages, such as surface emission, high color rendering, ease of dimming, free of mercury, which is contained in fluorescent lamps, ultraviolet-free light, etc.

The organic EL element is a light emitting element which is based on the principle that a fluorescent material emits light which is generated by recombination energy between holes injected from the anode and electrons injected from the cathode in the presence of applied electric field. Organic EL elements made of organic materials have been extensively studied since the report of a low voltage drive organic EL element by C. W. Tang et al. (see NON-PATENT DOCUMENT 1).

In the organic EL element, however, 80% or more of applied energy is dissipated as heat. Also, in the organic EL element, the ease at which a current flows increases exponentially with an increase in temperature. This local temperature increase leads to concentration of a current in the higher temperature portion, disadvantageously resulting in luminance unevenness due to a local increase in emission intensity or luminance unevenness due to degradation or damage of the organic EL element caused by a further temperature increase.

Therefore, for the organic EL element, a technique of efficiently dissipating heat generated during light emission has been proposed.

More specifically, an organic EL illumination device has been described in which heat dissipating means for dissipating heat of a substrate provided on a side opposite to the light emission side is provided on an outer surface of the substrate. The heat dissipating means includes any of a heat dissipation fin, a heat pipe, and a Peltier element. With this configuration, a simple or low-cost structure can be used to efficiently perform heat dissipation of the organic EL element (see, for example, PATENT DOCUMENT 1).

CITATION LIST

Patent Document

PATENT DOCUMENT 1: Japanese Patent Publication No. 2005-149853

NON-PATENT DOCUMENT 1: C. W. Tang, S. A. Van Slyke, Applied Physics Letters, Vol. 51, p. 913, 1987

SUMMARY OF THE INVENTION

Technical Problem

However, in the structure of PATENT DOCUMENT 1, the heat dissipating means is formed on the outer surface of the substrate for covering the organic EL element, and therefore, heat generated in the organic EL element is dissipated via the covering substrate. Therefore, heat generated during light emission in the organic EL element cannot be efficiently transferred to the outside, and as a result, accumulation of heat in the organic EL element causes disadvantageous damage to the organic layer included in the organic EL element.

Solution to the Problem

In order to solve the problem, an organic EL illumination device according to the present invention is one in which a plurality of organic EL elements are provided between a pair of substrates facing each other. A heat dissipation member which covers surfaces of the organic EL elements is provided in a space formed by the pair of substrates.

With this configuration, the organic EL element is covered by the heat dissipation member. Therefore, an area where the organic EL element as a heat source contacts the heat dissipation member is increased, whereby heat generated during light emission in the organic EL element can be efficiently transferred to the outside. Therefore, heat during light emission can easily escape to the outside, whereby accumulation of heat in the organic EL element can be reduced or prevented, and therefore, damage to the organic EL element can be reduced or prevented.

Moreover, the entirety of each organic EL element can be maintained at a uniform temperature, whereby a local temperature increase which increases the ease of current flow is reduced or prevented, and therefore, non-uniform light emission can be reduced.

Moreover, the heat dissipation member is provided in the space formed between the pair of substrates, whereby the strength of the organic EL illumination device is improved, and therefore, the shock resistance is improved.

In the organic EL illumination device of the present invention, the plurality of organic EL elements may be spaced apart from each other by a predetermined spacing.

With this configuration, the heat dissipation member contacts the organic EL element at the surface opposite to the light extraction surface, and the side surfaces, of the organic EL element, and therefore, the heat dissipation member can provide a satisfactory heat dissipating effect.

In the organic EL illumination device of the present invention, the heat dissipation member may be formed of an insulating resin containing a heat conductive material.

With this configuration, the heat dissipation member can have a simple structure.

In the organic EL illumination device of the present invention, one of the pair of substrates which is located on a light extraction side may be made of an optically transparent material, and the other substrate which is located on a side opposite to the light extraction side may be a substrate on which a metal film is formed or a metal substrate.

With this configuration, the heat dissipation member contacts the substrate on which a metal film is formed or the metal substrate, resulting in efficient heat dissipation.

In the organic EL illumination device of the present invention, a light reflection member may be provided to face a side surface of each of the plurality of organic EL elements.

With this configuration, light which is extracted through the side surface of the organic EL element to the light reflection member can be effectively used, whereby the light extraction efficiency is improved. As a result, an organic EL illumination device having low power consumption can be provided.

In the organic EL illumination device of the present invention, the light reflection member may be provided between the organic EL element and the heat dissipation member, and the light reflection member may contact both the organic EL element and the heat dissipation member.

With this configuration, although the light reflection member is provided, heat generated during light emission in the organic EL element can be efficiently transferred to the outside. As a result, heat during light emission can easily escape to the outside, whereby accumulation of heat in the organic EL element can be reduced or prevented, and therefore, damage to the organic layer can be reduced or prevented.

In the organic EL illumination device of the present invention, the light reflection member may be formed of a metal.

With this configuration, light extracted through the side surface of the organic EL element toward the light reflection member can be efficiently reflected, whereby a larger amount of light can be extracted through the light extraction side, and as a result, the extraction efficiency can be further improved. Also, heat generated during light emission in the organic EL element can be more efficiently transferred to the outside. Therefore, heat during light emission can more easily escape to the outside, whereby accumulation of heat in the organic EL element can be reduced or prevented, and therefore, damage to the organic layer can be reliably reduced or prevented.

In the organic EL illumination device of the present invention, the light reflection member may have a reflectance of 60% or more, and may be arranged so that the incident angle to the light reflection member of light extracted from the organic EL element toward the light reflection member is $0° < \theta < 90°$.

With this configuration, the number of times of reflection of light extracted to the light reflection member can be reduced, whereby light emitted from the organic EL element can used without less attenuation.

In the organic EL illumination device of the present invention, a light diffusion member including a transparent resin and transparent particles dispersed in the transparent resin may be provided between each of the plurality of organic EL elements, and the transparent particle may have a refractive index different from that of the transparent resin.

With this configuration, light extracted through the side surface of the organic EL element to the light diffusion member can be effectively used, whereby the light extraction efficiency is improved, and as a result, an organic EL illumination device having low power consumption can be provided.

In the organic EL illumination device of the present invention, the insulating resin may be a transparent resin, and the heat dissipation member may contain transparent particles dispersed in the insulating resin and having a refractive index different from that of the insulating resin.

With this configuration, light extracted from the organic EL element to the heat dissipation member can be diffused (reflected) by the transparent particles, and therefore, can be extracted through the light extraction side to the outside. Therefore, the light extracted from the organic EL element to the heat dissipation member can be effectively used, whereby the light extraction efficiency is improved. As a result, an organic EL illumination device having low power consumption can be provided.

In the organic EL illumination device of the present invention, the plurality of organic EL elements may include an emitting layer which emits a plurality of light beams having different colors.

With this configuration, the color of light extracted from the organic EL illumination device can be arbitrarily adjusted, resulting in higher color rendering.

A method for manufacturing an organic EL illumination device according to the present invention includes the steps of forming an organic EL element by successively stacking a first electrode, an organic layer, and a second electrode together on a support base, arranging a plurality of the organic EL elements on a first substrate so that the plurality of organic EL elements are spaced apart from each other by a predetermined spacing, forming a heat dissipation member between each of the plurality of organic EL elements by filling a space between each of the plurality of organic EL elements with an insulating resin containing a heat conductive material, and arranging the plurality of organic EL elements between the first and second substrates by putting the second substrate on the first substrate so that the plurality of organic EL elements are covered by the second substrate.

With this configuration, the organic EL element is covered by the heat dissipation member. Therefore, an area where the organic EL element as a heat source contacts the heat dissipation member is increased, whereby heat generated during light emission in the organic EL element can be efficiently transferred to the outside. Therefore, heat during light emission can easily escape to the outside, whereby accumulation of heat in the organic EL element can be reduced or prevented, and therefore, damage to the organic EL element can be reduced or prevented.

Moreover, the entirety of each organic EL element can be maintained at a uniform temperature, whereby a local temperature increase which increases the ease of current flow is reduced or prevented, and therefore, non-uniform light emission can be reduced.

Moreover, the heat dissipation member is provided in the space formed between the pair of substrates, whereby the strength of the organic EL illumination device is improved, and therefore, the shock resistance is improved.

Another method for manufacturing an organic EL illumination device according to the present invention includes the steps of forming an organic EL element by successively stacking a first electrode, an organic layer, and a second electrode together on a support base, arranging a plurality of the organic EL elements on a first substrate so that the plurality of organic EL elements are spaced apart from each other by a predetermined spacing, providing a light reflection member facing a side surface of each of the plurality of organic EL elements, forming a heat dissipation member between each of the plurality of organic EL elements by filling a space between each of the plurality of organic EL elements with an insulating resin containing a heat conductive material, and arranging the plurality of organic EL elements between the first and second substrates by putting the second substrate on the first substrate so that the plurality of organic EL elements are covered by the second substrate.

With this configuration, the organic EL element is covered by the heat dissipation member. Therefore, an area where the organic EL element as a heat source contacts the heat dissipation member is increased, whereby heat generated during light emission in the organic EL element can be efficiently transferred to the outside. Therefore, heat during light emission can easily escape to the outside, whereby accumulation of heat in the organic EL element can be reduced or prevented, and therefore, damage to the organic EL element can be reduced or prevented.

Moreover, the entirety of each organic EL element can be maintained at a uniform temperature, whereby a local temperature increase which increases the ease of current flow is reduced or prevented, and therefore, non-uniform light emission can be reduced.

Moreover, the heat dissipation member is provided in the space formed between the pair of substrates, whereby the strength of the organic EL illumination device is improved, and therefore, the shock resistance is improved.

Moreover, light extracted through the side surface of the organic EL element to the light reflection member can be effectively used, whereby the light extraction efficiency is improved. As a result, an organic EL illumination device having low power consumption can be provided.

Still another method for manufacturing an organic EL illumination device according to the present invention includes the steps of forming an organic EL element by successively stacking a first electrode, an organic layer, and a second electrode together on a support base, arranging a plurality of the organic EL elements on a first substrate so that the plurality of organic EL elements are spaced apart from each other by a predetermined spacing, providing a light diffusion member between each of the plurality of organic EL elements by filling a space between each of the plurality of organic EL elements with a transparent resin containing transparent particles, forming a heat dissipation member by providing an insulating resin containing a heat conductive material so that the plurality of organic EL elements and the light diffusion member are covered with the insulating resin, and arranging the plurality of organic EL elements between the first and second substrates by putting the second substrate on the first substrate so that the plurality of organic EL elements are covered by the second substrate.

With this configuration, the organic EL element is covered by the heat dissipation member. Therefore, an area where the organic EL element as a heat source contacts the heat dissipation member is increased, whereby heat generated during light emission in the organic EL element can be efficiently transferred to the outside. Therefore, heat during light emission can easily escape to the outside, whereby accumulation of heat in the organic EL element can be reduced or prevented, and therefore, damage to the organic EL element can be reduced or prevented.

Moreover, the entirety of each organic EL element can be maintained at a uniform temperature, whereby a local temperature increase which increases the ease of current flow is reduced or prevented, and therefore, non-uniform light emission can be reduced.

Moreover, the heat dissipation member is provided in the space formed between the pair of substrates, whereby the strength of the organic EL illumination device is improved, and therefore, the shock resistance is improved.

Moreover, light extracted through the side surface of the organic EL element to the light diffusion member can be effectively used, whereby the light extraction efficiency is improved. As a result, an organic EL illumination device having low power consumption can be provided.

In the organic EL illumination device manufacturing method of the present invention, the step of forming the organic EL element may be performed on the support base conveyed in roll-to-roll processing.

With this configuration, the first electrode, the second electrode, and the organic layer included in the organic EL element can be continuously formed in a single formation chamber, whereby the organic EL elements can be continuously formed. Therefore, the manufacturing process can be facilitated, and the productivity can be improved, whereby the organic EL illumination device can be manufactured at low cost.

Advantages Of The Invention

According to the present invention, in an organic EL illumination device including an organic EL element, heat generated during light emission can easily escape to the outside, whereby damage to an organic layer included in the organic EL element can be reduced or prevented.

DESCRIPTION OF EMBODIMENTS

Embodiments of the present invention will be described in detail hereinafter with reference to the accompanying drawings. Note that the present invention is not limited to the embodiments described below.

(First Embodiment)

Figure 1:
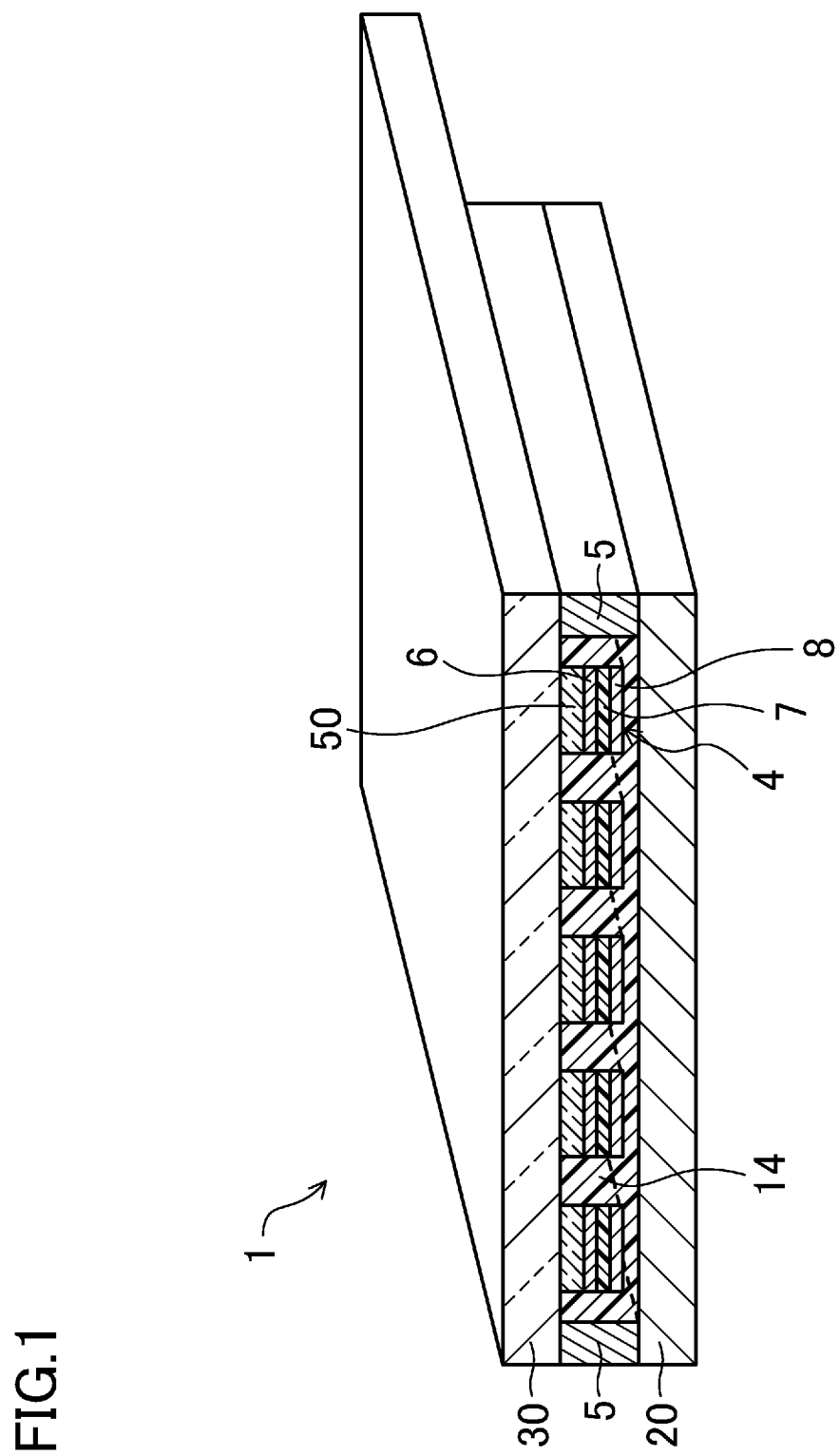
FIG. 1 is a cross-sectional perspective view of an organic EL illumination device according to a first embodiment of the present invention.
Figure 2:
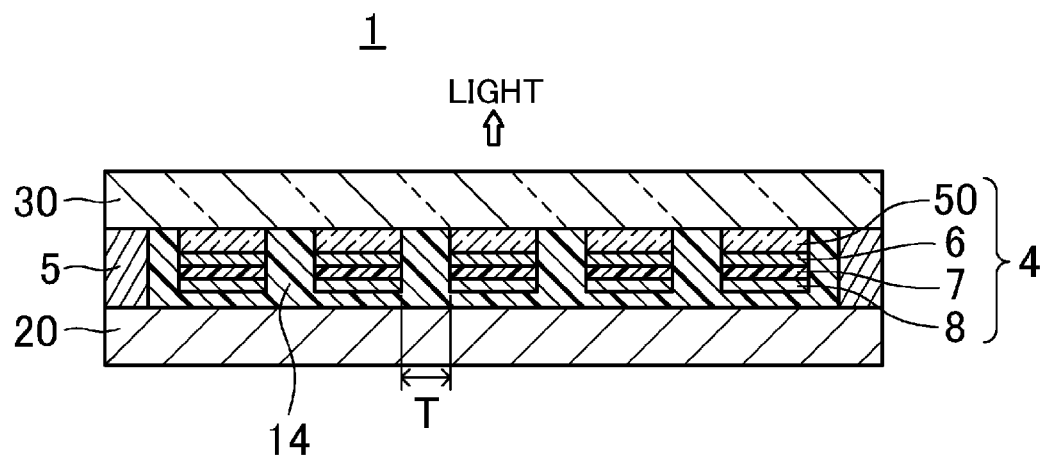
FIG. 2 is a cross-sectional view of the organic EL illumination device of the first embodiment of the present invention.
Figure 3:
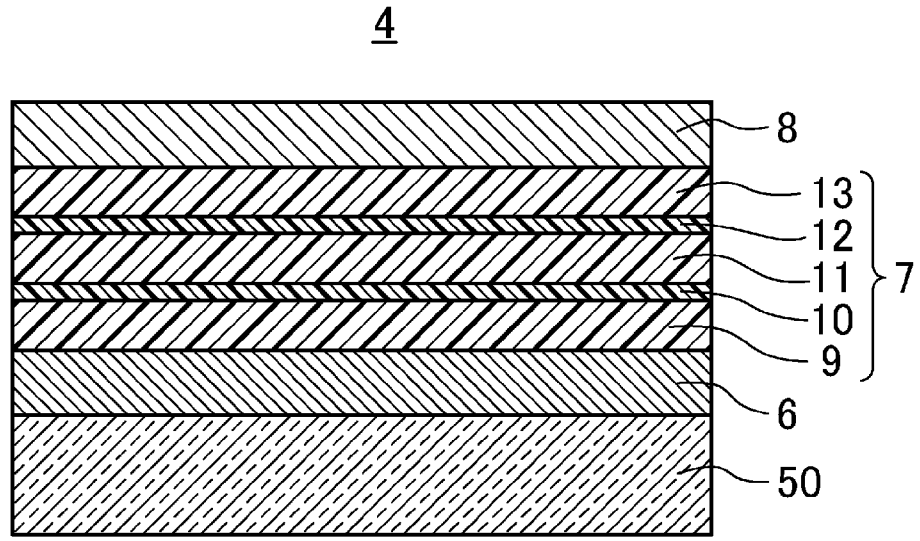
FIG. 3 is a cross-sectional view for describing an organic EL element included in the organic EL illumination device of the first embodiment of the present invention.

FIG. 1 is a cross-sectional perspective view of an organic EL illumination device according to a first embodiment of the present invention. FIG. 2 is a cross-sectional view of the organic EL illumination device of the first embodiment of the present invention. FIG. 3 is a cross-sectional view for describing an organic EL element included in the organic EL illumination device of the first embodiment of the present invention.

The organic EL illumination device is an organic EL device which includes an organic layer made of a luminescent material, and is used to, for example, illuminate a room or serve as a backlight for a liquid crystal display device.

As shown in FIGS. 1 and 2, the organic EL illumination device 1 includes an element substrate 30 (first substrate), a covering substrate 20 (second substrate) facing the element substrate 30, and organic EL elements 4 (light emitting elements) which are formed on the element substrate 30 and provided between the element substrate 30 and the covering substrate 20. The organic EL illumination device 1 further includes a sealing member 5 which is used to bond the element substrate 30 and the covering substrate 20 together, whereby the organic EL elements 4 are encapsulated. The element substrate 30 and the covering substrate 20 are bonded to each other via the sealing member 5.

The element substrate 30 and the covering substrate 20 are formed of, for example, an insulating material, such as glass, plastic, etc., or a metal material. The element substrate 30 and the covering substrate 20 may be in the shape of a flat or curved plate.

Note that, in order to improve the efficiency of heat dissipation, the covering substrate 20 is preferably made of a metal material, such as aluminum, stainless steel, etc., which have a high thermal conductivity. Also, graphite, which has a high emissivity, is preferably provided on the outer surfaces of the element substrate 30 and the covering substrate 20.

The element substrate 30 and the covering substrate 20 each have, for example, a length of about 100 mm, a width of about 100 mm, and a thickness of about 0.7 mm. The element substrate 30 and the covering substrate 20 are arranged to face each other with the organic EL elements 4 being interposed therebetween. The element substrate 30 and the covering substrate 20 are sealed using a UV curable resin etc. to encapsulate the organic EL elements 4. Thus, in this embodiment, the organic EL elements 4 are provided between a pair of substrates facing each other, i.e., the element substrate 30 and the covering substrate 20.

As shown in FIGS. 1 and 2, the organic EL element 4 includes a support base 50, a first electrode 6 (anode) provided on a surface of the support base 50, an organic layer 7 provided on a surface of the first electrode 6, and a second electrode 8 (cathode) provided on a surface of the organic layer 7. The organic EL elements 4 are spaced apart from each other by a spacing and arranged side by side in the width direction. As shown in FIGS. 1 and 2, the organic EL elements 4 are arranged and fixed to the element substrate 30 with the support base 50 facing or contacting the element substrate 30.

Examples of the support base 50 include a glass substrate, a metal substrate, a flexible substrate, etc. If roll-to-roll processing is employed, a flexible substrate is preferably used. Examples of the flexible substrate include: plastic films made of oriented polypropylene (OPP) resin, polyethylene terephthalate (PET) resin, polyethylene naphthalate (PEN) resin, or polyphenylene sulfide (PPS) resin, etc.; a silica glass film; a multilayer film of glass and film; etc.

The support base 50 is preferably a substrate having insulating properties and high transparency. If a film-like flexible substrate is used, the support base 50 preferably has a protection film, such as a $SiO_2$ film etc., which reduces or prevents alkali oxide leaking out of the flexible substrate. The support base 50 is in the shape of, for example, a tape having a width of about 1 cm, a length of about 15 cm, and a thickness of about 0.2 mm.

In order to efficiently inject holes into the organic layer 7, the first electrode 6 may be a metal electrode made of a metal having a high work function (e.g., Au, Ag, Pt, Ni, etc.), or a transparent electrode made of a transparent conductive material (e.g., ITO, IZO, IDIXO, GZO, $SnO_2$, etc.) for the purpose of extracting light through the first electrode 6.

In order to efficiently injecting electrons into the organic layer 7, the second electrode 8 may be an electrode including a stack of a metal having a low work function and a stable metal (e.g., Ca/Al, Ce/Al, Cs/Al, Ba/Al, etc.), an electrode containing a metal having a low work function (e.g., Ca:Al alloy, Mg:Ag alloy, Li:Al alloy, etc.), or an electrode including a combination of an insulating layer (thin film) and a metal electrode (e.g., LiF/Al, LiF/Ca/Al, $BaF_2$/Ba/Al, LiF/Al/Ag, etc.), etc. If the thickness of the second electrode 8 is reduced to 50 nm or less so that the second electrode 8 becomes a translucent film, light can be extracted through the second electrode 8.

Note that a reinforcement electrode made of, for example, an aluminum film may be provided at an end portion of a pattern in which the first electrode 6 is formed. The reinforcement electrode has a thickness of, for example, about 100 nm. The reinforcement electrode can reduce a voltage drop caused by the resistance of the electrode, whereby emission unevenness can be reduced or eliminated.

A protection film may be provided to cover the second electrode 8, thereby reducing or preventing external moisture entering the organic layer 7. The protection film may be, for example, an insulating inorganic film made of SiON, SiO, or SiN, etc.

As shown in FIG. 3, the organic layer 7 includes a hole injection layer 9, a hole transport layer 10 formed on a surface of the hole injection layer 9, and an emitting layer 11 formed on a surface of the hole transport layer 10 and for emitting any of red, green, and blue light. The organic layer 7 also includes an electron transport layer 12 formed on a surface of the emitting layer 11, and an electron injection layer 13 formed on a surface of the electron transport layer 12. The hole injection layer 9, the hole transport layer 10, the emitting layer 11, the electron transport layer 12, and the electron injection layer 13 are successively stacked together to form the organic layer 7.

The hole injection layer 9 and the hole transport layer 10 have a function of efficiently injecting and transporting holes received from the first anode 6 to the emitting layer. Examples of materials for hole injection and transportation include: low molecular materials, such as 4,4'-bis[N-(1-naphtyl)-N-phenylamino]biphenyl (α-NPD) represented by:

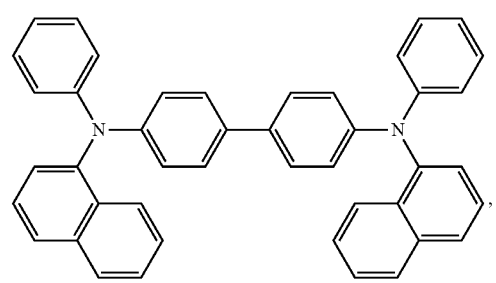 [SMILES: c1ccc(N(c2ccc(-c3ccc(N(c4ccccc4)c4cccc5ccccc45)cc3)cc2)c2cccc3ccccc23)cc1 ; ","]

copper phthalocyanines (CuPc) represented by:

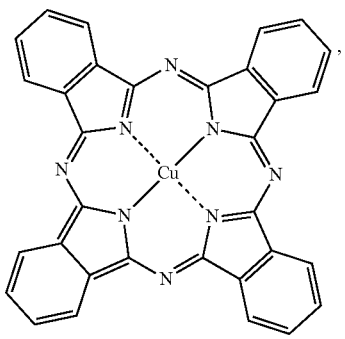

porphyrins, aromatic tertiary amines (N,N'-bis-(3-methylphenyl)-N,N'-bis-(phenyl)-benzidine (TPD), N,N'-di(naphthalene-1-yl)-N,N'-diphenylbenzidine (NPD), etc.), hydrazones, quinacridones, styryl amines, etc.; polymer materials, such as polyaniline (PANI), 3,4-polyethylenedioxythiophene/polystyrenesulfonate (PEDT/PSS), poly[triphenylamine derivative] (Poly-TPD), polyvinylcarbazole (PVCz), etc.; precursors of polymer materials, such as a precursor of poly(p-phenylene vinylene) (Pre-PPV), a precursor of poly(p-naphthalene vinylene) (Pre-PNV), etc.; etc. The hole injection layer 9 and the hole transport layer 10 have a thickness of, for example, about 30 nm and about 20 nm, respectively.

The HOMO level of the hole injection material is preferably between the work function of the first electrode 6 and the HOMO level of the emitting layer 11. The HOMO level of the hole transport material is preferably between the HOMO level of the hole injection layer 9 and the HOMO level of the emitting layer 11 because holes can be more efficiently injected and transported to the emitting layer 11, whereby the voltage of the device can be reduced and the emission efficiency of the device can be increased. In order to increase the emission efficiency of the emitting layer 11, the LUMO level of the hole transport layer 10 is preferably set to be lower than the LUMO level of the emitting layer 11 to reduce or prevent leakage of electrons from the emitting layer 11. Moreover, the band gap of the hole transport layer 10 is preferably set to be larger than the band gap of the emitting layer 11 in order to confine excitons in the emitting layer 11.

Here, the hole injection layer 9 can be formed directly by a dry process, such as vapor deposition etc., using at least one hole injection material. The hole injection layer 9 may contain two or more hole injection materials. The hole injection layer 9 may contain an additive (a donor, a acceptor, etc.), etc. The hole injection layer 9 may have a monolayer or multilayer structure.

Similarly, the hole transport layer 10 can be formed directly by a dry process, such as vapor deposition etc., using at least one hole transport material. The hole transport layer 10 may contain two or more hole transport materials. The hole transport layer 10 may contain an additive (a donor, a acceptor, etc.), etc. The hole transport layer 10 may have a monolayer or multilayer structure.

When a voltage is applied to the emitting layer 11 by the first and second electrodes 6 and 8, holes and electrons are injected from the two electrodes into the emitting layer 11, in which the hole and the electron are recombined together.

The emitting layer 11 is made of a luminescent material doped with a dopant. Examples of the luminescent material include: fluorescent organic materials, such as carbazole derivatives (4,4'-bis(carbazole-9-yl)-biphenyl (CBP) represented by:

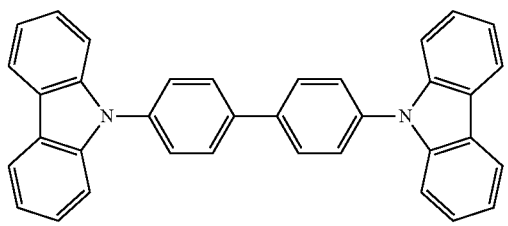 [SMILES: c1ccc2c(c1)c1ccccc1n2-c1ccc(-c2ccc(-n3c4ccccc4c4ccccc43)cc2)cc1]

etc.), triazole derivatives (2,4-triazole (TAZ),3-(4-biphenyl-yl)-4-phenyl-5-t-butylphenyl-1,2,4-triazole (TAZ) etc.), aromatic dimethylidynes (4,4'-bis(2,2'-diphenylvinyl)-biphenyl (DPVBi) etc.), oxadiazoles (5-methyl-2-[2-[4-(5-methyl-2-benzoxazolyl)phenyl]vinyl]benzoxazole etc.), styryl benzenes (1,4-bis(2-methyl styryl)benzene etc.), thiopyrazine dioxide derivatives, benzoquinone derivatives, naphthoquinone derivatives, anthraquinone derivatives, diphenoquinone derivatives, fluorenone derivatives, etc.; fluorescent organic metal compounds, such as azomethine zinc complex, (8-hydroxyquinolinato)aluminum complex (Alq3), etc.; polymer luminescent materials, such as poly(2-decyloxy-1, 4-phenylene)DO-PPP, poly[2,5-bis-[2-(N,N,N-triethylammonium)ethoxy]-1,4-phenyl-alto-1,4-phenylene]dibromide, poly[2-(2'-ethylhexyloxy)-5-methoxy-1,4-phenylenevinylene] (MEH-PPV), poly[5-methoxy-(2-propanoxysulfonide)-1,4-phenylenevinylene] (MPS-PPV), poly[2,5-bis-(hexyloxy)-1,4-phenylene-(1-cyanovinylene)] (CN-PPV), (poly(9,9-dioctylfluorene) (PDAF), polyspiro, etc.; and precursors of polymer luminescent materials, such as precursors of PPV, precursors of PNV, precursors of PPP, etc.

Examples of the dopant include (2-phenylpyridine)iridium (Ir(ppy)₃) (green dopant) represented by:

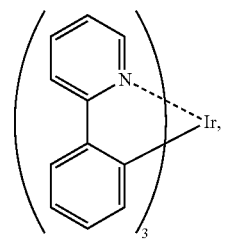

2-(4'-t-butylphenyl)-5-(4"-biphenyl-yl)-1,3,4-oxadiazole (t-BuPBD) (blue dopant) represented by:

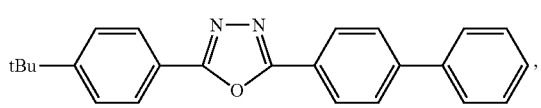 [SMILES: CC(C)(C)c1ccc(-c2nnc(-c3ccc(-c4ccccc4)cc3)o2)cc1 ; ","]

bis(2-(2'-benzo[4,5-a]thienyl)-pyridinato-N,C3')iridium (acetylacetonate) ((Btp)₂Ir(acac)) (red dopant) represented by:

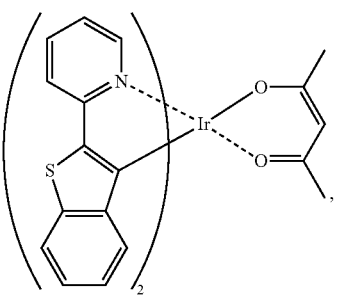

and etc.

These dopants are injected in an amount of, for example, about 6 percent by weight relative to the luminescent material. The emitting layer 11 has a thickness of, for example, about 30 nm.

Note that a green emitting layer, a blue emitting layer, and a red emitting layer doped with a green dopant, a blue dopant, and a red dopant, respectively, may be stacked together, whereby white light is obtained by mixing green, blue, and red light.

The emitting layer 11 can be formed of at least one luminescent material. The emitting layer 11 may contain two or more luminescent materials or may have a multilayer structure.

The emitting layer 11 may include at least one hole transport material, an electron transport material, and a luminescent material. The emitting layer 11 can be formed directly by a dry process, such as vapor deposition etc., using the luminescent material, the hole transport material, and the electron transport material. The hole transport material for the emitting layer 11 may be similar to those for the hole transport layer 10 described above. The electron transport material for the emitting layer 11 may be similar to those for the electron transport layer 12.

The electron transport layer 12 and the electron injection layer 13 have a function efficiently injecting and transporting electrons received from the second electrode 10 to the emitting layer 11. Examples of the electron transport material and the electron injection material include tris(8-quinolinyloxy) aluminum (Alq3) represented by:

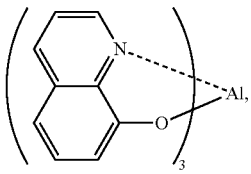

and 3-phenyl-4(1'-naphthyl)-5-phenyl-1,2,4-triazole (TAZ) represented by:

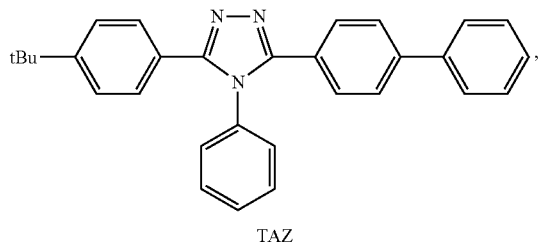 [SMILES: CC(C)(C)c1ccc(-c2nnc(-c3ccc(-c4ccccc4)cc3)n2-c2ccccc2)cc1 ; ","]

and etc.

Examples of the electron transport material includes: low molecular materials, such as oxadiazole derivatives, triazole derivatives, thiopyrazinedioxide derivatives, benzoquinone derivatives, naphthoquinone derivatives, anthraquinone derivatives, diphenoquinone derivatives, fluorenone derivative, etc.; and polymer materials, such as poly(oxadiazole) (Poly-OXZ), polystyrene derivatives (PSS), etc.

Examples of the electron injection material include fluorides, such as lithium fluoride (LiF), barium fluoride ($BaF_2$), etc., oxides, such as lithium oxide ($Li_2O$) etc., etc.

The electron transport layer 12 and the electron injection layer 13 have, for example, a thickness of about 30 nm and about 1 nm, respectively.

The LUMO level of the electron transport material is preferably set to be between the LUMO level of the electron injection layer 13 and the LUMO level of the emitting layer 11 because electrons can be efficiently injected and transported to the emitting layer 11, whereby the voltage of the device can be reduced or the emission efficiency of the device can be increased. In order to increase the emission efficiency of the emitting layer 11, the HOMO level of the electron transport layer 12 is preferably set to be higher than the HOMO level of the emitting layer 11 to reduce or prevent leakage of holes from the emitting layer 11. Moreover, the band gap of the electron transport layer 12 is preferably set to be larger than the band gap of the emitting layer 11 in order to confine excitons in the emitting layer 11.

In order to more efficiently inject and transport electrons, it is preferable to use the electron injection material whose LUMO energy level is higher than that of the electron transport material, and it is preferable to use the electron transport material whose electron mobility is higher than that of the electron injection material.

The electron transport layer 12 can be formed directly by a dry process, such as vapor deposition etc., using at least one electron transport material. The electron transport layer 12 may contain two or more electron transport materials, and may contain an additive (a donor, an acceptor, etc.), etc. The electron transport layer 12 may have a monolayer or multilayer structure.

Similarly, the electron injection layer 13 can be formed directly by a dry process, such as vapor deposition etc., using at least one electron injection material. The electron injection layer 13 may contain two or more electron injection materials, and may contain an additive (a donor, an acceptor, etc.), etc. The electron injection layer 13 may have a monolayer or multilayer structure.

The sealing member 5 which bonds the element substrate 30 and the covering substrate 20 together is used to fix the element substrate 30 and the covering substrate 20 to each other. Examples of a material for the sealing member 5 include ultraviolet curable resins, such as acrylic resins, epoxy resins, etc., and thermosetting resins.

A spacer 17 (not shown) is contained in the sealing member 5 in order to control a space between the element substrate 30 and the covering substrate 20. The spacer is formed of, for example, silicon oxide ($SiO_2$).

A plurality of the organic EL elements 4 are provided in a space formed by the element substrate 30 and the covering substrate 20, and are connected to extraction terminals of the element substrate 30 so that the organic EL elements 4 are electrically connected together in parallel.

The organic EL illumination device 1 of this embodiment is applicable to any of the following types: bottom emission type, in which light is extracted through the element substrate 30 via the first electrode 6; top emission type, in which light is extracted through the covering substrate 20 via the second electrode 8; and double-sided emission type, in which light is extracted through both the element substrate 30 and the covering substrate 20. Of the element substrate 30 and the covering substrate 20 between which the organic EL elements 4 are interposed, at least one through which light is extracted may be transparent.

In the organic EL illumination device 1 thus configured, when a voltage is applied between the first electrode 6 and the second electrode 8, holes are injected into the emitting layer 11 from the anode one of the first and second electrodes 6 and 8, and electrons are injected into the emitting layer 11 from the cathode one. The hole and the electron are recombined in the emitting layer 11 to emit energy, which in turn excites the luminescent material of the emitting layer 11. When the excited luminescent material returns from the excited state to the ground state, fluorescent light or phosphorescent light is released and emitted to the outside.

Here, as shown in FIG. 2, the organic EL illumination device 1 of this embodiment includes a heat dissipation member 14 which has a higher thermal conductivity than that of the air. The heat dissipation member 14 is used in the organic EL element 4 to efficiently conduct heat generated during light emission to the outside.

The heat dissipation member 14 is made of an insulating resin. Examples of the insulating resin include acrylic resins, epoxy resins, polyamide resins, polyacetal resins, polyphenylene ether resins, polycarbonate resins, ABS resins, polyolefin resins, polystyrene resins, methacrylic resins, etc.

Note that the heat dissipation member 14 may be made of a known material, and may contain at least a heat conductive material having a high thermal conductivity in addition to the above resin.

Silicone resins contain low molecular siloxane. If the silicone resin is attached to a heat generating material, low molecular siloxane gas is generated. The gas adheres to an electrode contact etc. to generate silicon dioxide, which may cause a defective contact. It is preferable not to use the silicone resin.

The heat dissipation member 14 contains a heat conductive material having a high thermal conductivity which is contained in the insulating resin. In other words, the heat dissipation member 14 is made of an insulating resin containing a heat conductive material.

As shown in FIG. 2, in the organic EL illumination device 1 of this embodiment, the heat dissipation member 14 is provided between each organic EL element 4, and also covers a surface of each organic EL element 4. Specifically, as shown in FIG. 2, the heat dissipation member 14 which covers the surfaces of the organic EL elements 4 is provided in a space formed between the element substrate 30 and the covering substrate 20, between each organic EL element 4.

With such a configuration, the organic EL element 4 is covered by the heat dissipation member 14 having a higher thermal conductivity than that of the air. Therefore, an area where the organic EL element 4 as a heat source contacts the heat dissipation member 14 is increased (i.e., the heat dissipation member 14 contacts surfaces of the organic EL element 4 other than the surface of the organic EL element 4 which contacts the element substrate 30). Therefore, in the organic EL element 4, heat generated during light emission can be efficiently transferred to the outside. Therefore, heat during light emission can easily escape to the outside, whereby accumulation of heat in the organic EL element 4 can be reduced or prevented, and therefore, damage to the organic layer 11 can be reduced or prevented.

Moreover, the entirety of each organic EL element 4 can be maintained at a uniform temperature, whereby a local temperature increase which increases the ease of current flow is reduced or prevented, and therefore, non-uniform light emission can be reduced.

The heat dissipation member 14 is provided by filling the inside of the organic EL illumination device 1 (i.e., the space formed between the element substrate 30 and the covering substrate 20) with an insulating resin containing a heat conductive material, whereby the strength of the organic EL illumination device 1 is improved, and therefore, the shock resistance is improved.

The heat conductive material having a high thermal conductivity may be, for example, a versatile heat conductive filler. Examples of the heat conductive filler include ceramic powders of boron nitride, silicon nitride, aluminum nitride, alumina, magnesia, etc. The heat conductive filler may contain one or two or more of these components. A commercially available example of the heat conductive filler is F-CO™ sheet manufactured by FURUKAWA ELECTRIC CO. LTD.

The heat conductive filler may have any shape, such as an irregular pulverized shape, a spherical shape, a fiber shape, a needle shape, a scale shape, etc., and has an average particle size of about 1-100 µm. Moreover, the heat conductive filler more preferably additionally contain a desiccant, such as CaO, BaO, etc. As a result, damage caused by external moisture etc., can be reduced or prevented.

In order to reliably providing the heat dissipation member 14 between each organic EL element 4, the organic EL elements 4 are preferably spaced apart from each other by a predetermined spacing T (e.g., $0.2\text{-}1\times10^4$ µm, preferably 100-$5\times10^3$ µm). This is because, if the spacing T is excessively narrow, heat generated from the organic EL element 4 cannot be satisfactorily dissipated, and if the spacing T is large, the number of organic EL elements 4 which can be provided in the organic EL illumination device 1 decreases, and therefore, the amount of light emitted from the organic EL illumination device 1 is reduced.

In other words, as shown in FIG. 1, by spacing the organic EL elements 4 apart from each other by the predetermined spacing T, the heat dissipation member 14 contacts the organic EL element 4 at the surface opposite to the light extraction surface, and the side surfaces, of the organic EL element 4, and therefore, the heat dissipation member 14 can provide a satisfactory heat dissipating effect.

Note that the form of the heat dissipation member 14 is not particularly limited and may be grease, gel, or sheet. Moreover, the heat dissipation member 14 preferably has an Asker hardness of C50 or less, more preferably between F10 and C50 both inclusive. This is because if the Asker hardness of the heat dissipation member 14 is less than F10, the heat dissipation member 14 is too soft to be used, or conversely, if the Asker hardness exceeds C50, it is difficult to provide the heat dissipation member 14 between each organic EL element 4. Note that the Asker hardness used herein indicates a value measured at 25° C.

In order to further improve the heat dissipating effect, it is preferable that the heat dissipation member 14 contact the second electrode 8. In this case, it is preferable that the support base 50 be provided on the light extraction side. Also, in this case, if the second electrode 8 is thin, the organic EL element 4 may be damaged. Therefore, the second electrode 8 preferably has a thickness of 100 nm-1 µm.

In this embodiment, the organic EL element 4, which is a light emitting element, emits a plurality of light beams having different colors (e.g., red, green, and blue), i.e., the organic EL elements 4 include the emitting layer 11 which emits red light, green light, and blue light. With such a configuration, the color of light extracted from the organic EL illumination device 1 can be arbitrarily adjusted, resulting in higher color rendering.

If the substrate (in this embodiment, the covering substrate 20) provided on the side opposite to the light extraction side is a substrate on which a metal film having a high thermal conductivity etc. is formed, or a metal substrate having a high thermal conductivity, the heat dissipation member 14 contacts the covering substrate 20 which is the substrate on which the metal film is formed or the metal substrate, whereby heat can be efficiently dissipated.

Figure 4:
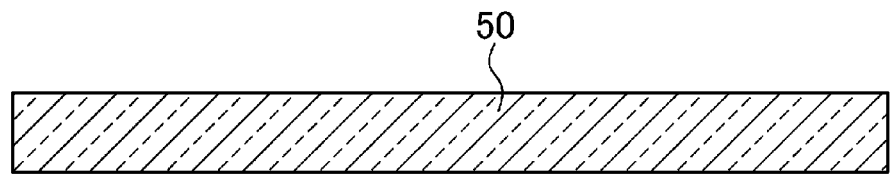
FIGS. 4(a)-4(e) are cross-sectional views showing a method for manufacturing the organic EL element.
Figure 4:
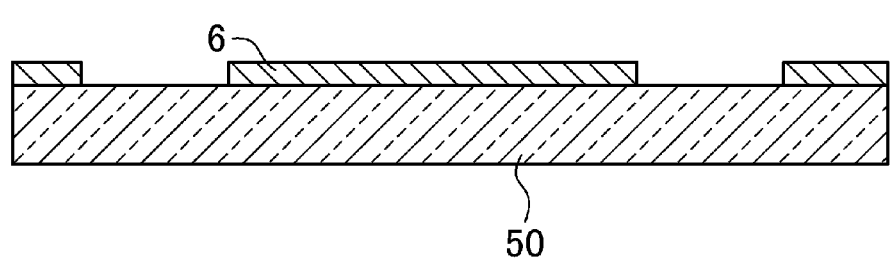
Figure 4:
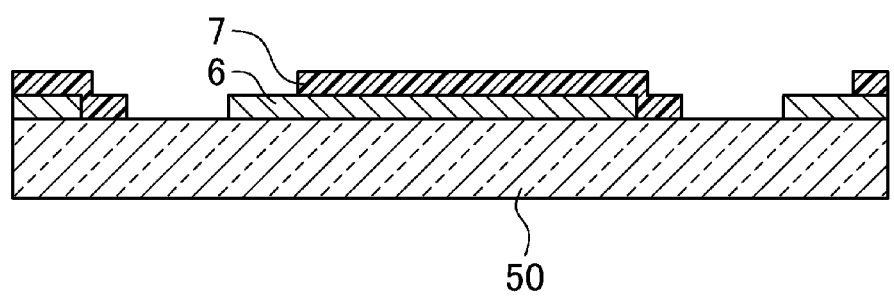
Figure 4:
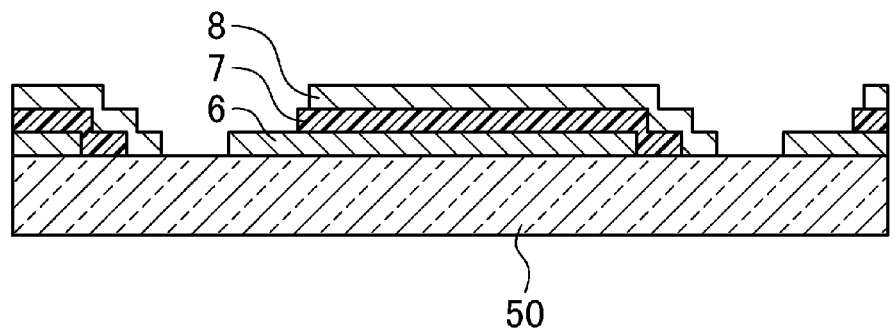
Figure 4:
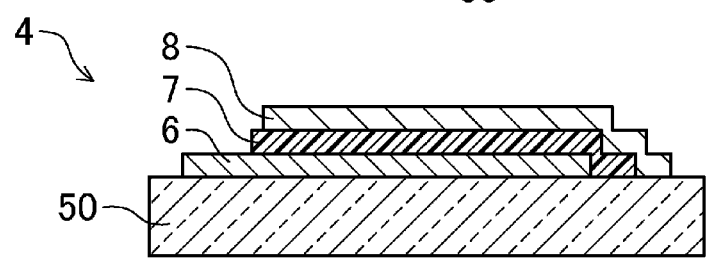
Figure 5:
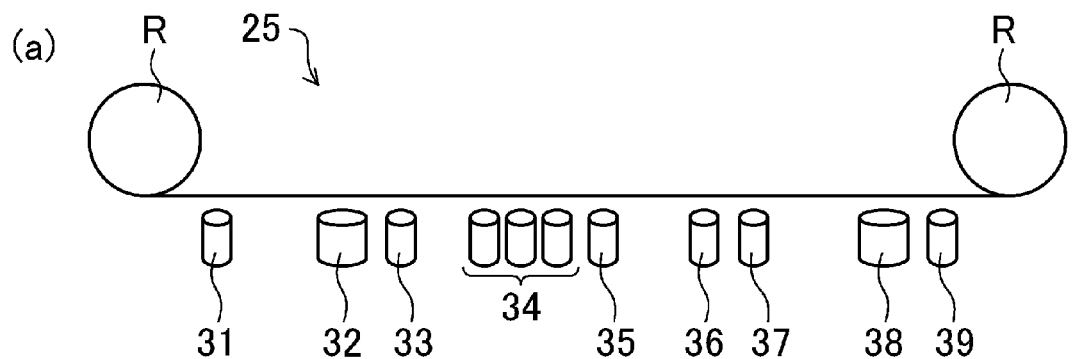
FIGS. 5(a)-5(e) are diagrams for describing a method for manufacturing the organic EL illumination device using roll-to-roll processing.
Figure 5:
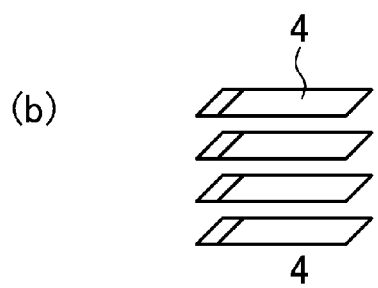
Figure 5:
Figure 5:
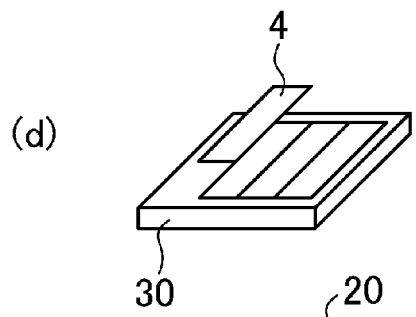
Figure 5:
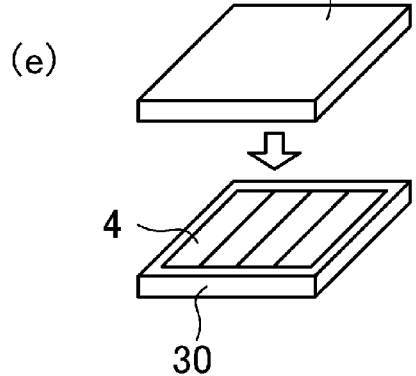

Next, an example method for manufacturing the organic EL illumination device of this embodiment will be described. FIGS. 4(*a*)-4(*e*) are cross-sectional views showing a method for manufacturing the organic EL element. FIGS. 5(*a*)-5(*e*) are diagrams for describing a method for manufacturing the organic EL illumination device using roll-to-roll processing.

In this embodiment, the organic EL elements 4 which are a band-like light emitting element are formed by roll-to-roll processing while a film tape which will form the support base 50 is conveyed at a predetermined speed (e.g., 1 m/sec).

In roll-to-roll processing, while a roll of continuous film-like flexible substrate having, for example, a length of several hundreds of meters and a width of about one meter is unwound and intermittently or continuously conveyed, the organic EL elements are formed on the flexible substrate, which is then wound into a roll again.

If roll-to-roll processing is used, the organic EL elements can be continuously formed, and therefore, the productivity is improved, whereby the organic EL illumination device can be manufactured at low cost.

<Support Base Preparing Step>

Initially, as shown in FIG. 4(*a*), a film tape which will form the support base 50 of the organic EL element 4 is prepared. The film tape has, for example, a width of about 20 mm and a length of about 10 m. The film tape will be cut into pieces each having a length of, for example, 15 cm, which is a size of the organic EL element 4. Note that a series of manufacturing steps described below are performed in an inert gas atmosphere (e.g., nitrogen, argon, etc.) in a glovebox etc.

Next, the support base 50 is attached to a roll-to-roll vapor deposition device 25 shown in FIG. 5(*a*). The roll-to-roll vapor deposition device 25 includes, between two rolls R for winding the film tape, a cleaning section 31, a first electrode film formation section 32, an etching section 33, an organic layer formation section 34, an etching section 35, a second electrode film formation section 36, an etching section 37, a protection film formation section 38, and an etching section 39. The film formation sections 32, 34, 36, and 38 are each means for forming a layer by vapor deposition.

Next, the cleaning section 31 performs microwave plasma dry cleaning on a surface of the film tape.

<First Electrode Formation Step>

Next, the first electrode film formation section 32 forms, for example, an ITO film on an entire surface of the support base 50. Thereafter, as shown in FIG. 4(*b*), the etching section 33 etches the ITO film to form the first electrode 6 on the support base 50.

In this case, for example, the etching is performed so that the first electrode 6 has a rectangular pattern shape having a width which is equal to the width of the film tape and a predetermined length in the length direction of the film tape. In this etching, patterning may be performed so that the first electrode 6 has a rectangular pattern shape having a width which is equal to the width of the film tape and a predetermined length in the length direction of the film tape, and therefore, a mask is not required. Next, after the formation of the first electrode 6, a surface of the first electrode 6 is cleaned by, for example, 10-min ultrasonic cleaning and 30-min UV ozone cleaning using acetone or isopropyl alcohol.

<Organic Layer Formation Step>

Next, the organic layer formation section 34 forms each layer of the organic layer 7 on an entire surface of the first electrode 6 by vapor deposition. Thereafter, the etching section 35 performs patterning on the organic layer 7 to form the organic layer 7 on the first electrode 6 as shown in FIG. 4(*c*).

In this case, the organic layer 7 is patterned to cover a pattern in which the first electrode 6 has been formed. In this etching, patterning is performed so that the organic layer 7 has a rectangular pattern shape having a width which is equal to the width of the film tape and a predetermined length in the length direction of the film tape, and therefore, a mask is not required.

<Second Electrode Formation Step>

Next, the second electrode film formation section 36 forms the second electrode 8 on an entire surface of the organic layer 7. Next, the etching section 37 performs patterning on the second electrode 8 to form the second electrode 8 on the organic layer 7 as shown in FIG. 4(*d*).

In this case, the second electrode 8 is patterned to cover a pattern in which the first electrode 6 and the organic layer 7 have been formed. In this etching, patterning is performed so that the second electrode 8 has a rectangular pattern shape having a width which is equal to the width of the film tape and a predetermined length in the length direction of the film tape, and therefore, a mask is not required.

Here, in this embodiment, as described above, in the first electrode formation step, the organic layer formation step, and the second electrode formation step, the first electrode 6, the organic layer 7, and the second electrode 8 are formed by forming the respective formation films on an entire surface of the support base 50 before patterning by etching. In this case, the first electrode 6, the organic layer 7, and the second electrode 8 can be formed by controlling the vapor deposition rates of the respective materials for the first electrode 6, the organic layer 7, and the second electrode 8. More specifically, the first electrode 6, the organic layer 7, and the second electrode 8 are formed using predetermined patterns by controlling the vapor deposition rates by controlling the ON/OFF of the first electrode film formation section 32, the organic layer formation section 34, and the second electrode film formation section 36 which are vapor deposition sources, or controlling the ON/OFF of the etching sections 33, 35, and 37 which are etching sources.

Conventionally, when an electrode and an organic layer etc. are formed on a flexible substrate, such as a resin film etc., by roll-to-roll processing in order to mass-produce an organic EL device at low cost, patterning is required, which is performed by employing a photolithography process, a wet etching process, or a vapor deposition mask process, etc. However, in these processes, it is necessary to produce a metal mask etc. serving as a photomask or a deposition mask, resulting in a disadvantageous increase in manufacturing cost. It is also necessary to prepare different masks corresponding to different patterns of an electrode and an organic layer to be formed, and change these masks, depending on the formation steps, resulting in a disadvantageous decrease in productivity.

On the other hand, in this embodiment, as described above, the first electrode 6, the organic layer 7, and the second electrode 8 are formed by controlling the deposition rate. Therefore, unlike the conventional roll-to-roll processing, a metal mask etc. serving as a photomask or a vapor deposition mask is not required. Therefore, the cost can be reduced. Also, it is not necessary to prepare different masks corresponding to different patterns of an electrode and an organic layer to be formed or change these masks, and therefore, the manufacture of the organic EL element 4 can be facilitated. As a result, the productivity of the organic EL element can be improved.

<Protection Film Formation Step>

The protection film formation section 38 forms a protection film made of, for example, $SiO_2$, to cover the second electrode 8. Thereafter, the etching section 39 performs patterning on the protection film.

Note that, instead of forming the protection film, a protection film for covering the device may be attached before being wound around a roll.

The film tape on which the first electrode 6, the organic layer 7, the second electrode 8, and the protection film have been thus formed is wound around a roll R. Thereafter, as shown in FIGS. 4(e) and 5(b), the film tape is cut into pieces each having a predetermined length, where each piece is the organic EL element 4.

(Testing Step)

Next, the fabricated organic EL elements 4 are tested using a known technique. Thereafter, as shown in FIG. 5(c), a defective product(s) is removed, and as shown in FIG. 5(d), non-defective organic EL elements 4 are fixed to the element substrate 30 using a transparent thermosetting resin etc., and the organic EL elements 4 are electrically connected to the extraction terminals of the element substrate 30. In this case, the organic EL elements 4 are provided on the element substrate 30 and spaced apart from each other by the predetermined spacing T.

<Heat Dissipation Member Formation Step>

After the organic EL elements 4 are fixed to the element substrate 30, an insulating resin containing a heat conductive material is provided to fill a space between each organic EL elements 4, thereby forming the heat dissipation member 14 between each organic EL element 4.

<Sealing Step>

As shown in FIG. 5(e), after the organic EL elements 4 are fixed to the element substrate 30, the covering substrate 20 is put on the element substrate 30 to cover the organic EL elements 4, followed by sealing using a UV curable resin etc. Thus, the organic EL illumination device 1 can be fabricated in which the organic EL elements 4 are provided between a pair of substrates facing each other, i.e., the element substrate 30 and the covering substrate 20.

Note that, as the sealing process, instead of using the UV curable resin, for example, the element substrate 30 and the covering substrate 20 may be bonded together using a thermosetting resin, or by a glass fusion process etc. When the sealing is performed using glass etc., a moisture absorbent, such as barium oxide etc., may be contained in the inert gas. Thus, by encapsulating the organic layer and the electrode, external oxygen and moisture entering the organic EL illumination device 1 can be reduced or prevented, whereby the life of the organic EL illumination device 1 can be extended.

The above embodiment has the following advantages.

(1) In this embodiment, the heat dissipation member 14 covering the surface of the organic EL element 4 is provided in a space formed between a pair of substrates, i.e., the element substrate 30 and the covering substrate 20. Therefore, the organic EL element 4 is covered by the heat dissipation member 14 having a higher thermal conductivity than the air. Therefore, an area where the organic EL element 4 as a heat source contacts the heat dissipation member 14 is increased. Therefore, in the organic EL element 4, heat generated during light emission can be efficiently transferred to the outside. Therefore, heat during light emission can easily escape to the outside, whereby accumulation of heat in the organic EL element 4 can be reduced or prevented, and therefore, damage to the organic layer 11 can be reduced or prevented.

(2) The entirety of each organic EL element 4 can be maintained at a uniform temperature, whereby a local temperature increase which increases the ease of current flow is reduced or prevented, and therefore, non-uniform light emission can be reduced.

(3) The heat dissipation member 14 is provided by filling the inside of the organic EL illumination device 1 with an insulating resin containing a heat conductive material, whereby the strength of the organic EL illumination device 1 is improved, and therefore, the shock resistance is improved.

(4) In this embodiment, the organic EL elements 4 are spaced apart from each other by the predetermined spacing T. Therefore, the heat dissipation member 14 contacts the organic EL element 4 at the surface opposite to the light extraction surface, and the side surfaces, of the organic EL element 4, and therefore, the heat dissipation member 14 can provide a satisfactory heat dissipating effect.

(5) In this embodiment, the heat dissipation member 14 is formed of an insulating resin containing a heat conductive material. Therefore, the heat dissipation member 14 can have a simple structure.

(6) In this embodiment, the element substrate 30 provided on the light extraction side is made of an optically transparent material, and the covering substrate 20 provided on the side opposite to the light extraction side is a substrate on which a metal film is formed or a metal substrate. Therefore, the heat dissipation member 14 contacts the covering substrate 20 which is a substrate on which a metal film is formed or a metal substrate, whereby heat can be efficiently dissipated.

(7) In this embodiment, the organic EL elements 4 include the emitting layer 11 which emits a plurality of light beams having different colors. Therefore, the color of light extracted from the organic EL illumination device 1 can be arbitrarily adjusted, resulting in higher color rendering.

(Second Embodiment)

Figure 6:
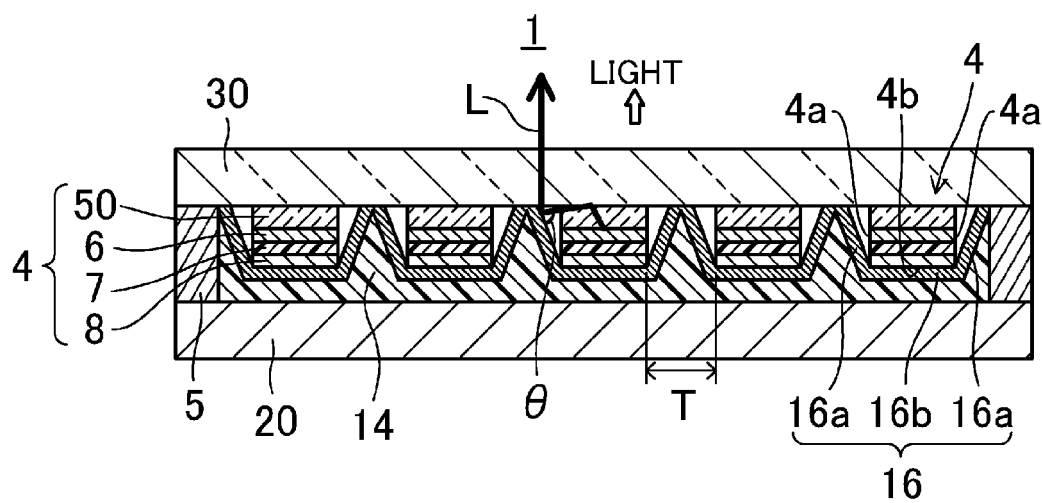
FIG. 6 is a cross-sectional view of an organic EL illumination device according to a second embodiment of the present invention.

Next, a second embodiment of the present invention will be described. FIG. 6 is a cross-sectional view of an organic EL illumination device according to a second embodiment of the present invention. Note that parts similar to those of the first embodiment are indicated by the same reference characters and will not be described. The entire structure of the organic EL illumination device and a method for manufacturing the organic EL illumination device are similar to those described in the first embodiment and will not be here described in detail.

In this embodiment, as shown in FIG. 6, the second embodiment is different from the first embodiment in that light reflection members 16 are provided to cover respective organic EL elements 4.

More specifically, as shown in FIG. 6, the light reflection member 16 has substantially a trapezoidal cross-section. The light reflection member 16 has lateral side portions (sloped side portions) 16a facing side surfaces 4a of the organic EL element 4.

With such a configuration, as shown in FIG. 6, light L which is emitted by the organic EL element 4, is then reflected by an interface between the support base 50 and the outside, and is then extracted through the side surface 4a of the organic EL element 4 toward the light reflection member 16, is reflected (diffused) by the light reflection member 16, so that the light L can be extracted through the light extraction side to the outside. Therefore, the light L extracted through the side surface 4a of the organic EL element 4 toward the light reflection member 16 can be effectively used.

As shown in FIG. 6, an upper side portion 16b of the light reflection member 16 is provided between the organic EL element 4 and the heat dissipation member 14, and contacts both a surface 4b opposite to the light extraction side of the organic EL element 4 and the heat dissipation member 14. Therefore, even if the light reflection members 16 are provided to cover the organic EL elements 4, heat generated in the organic EL element 4 as a heat source can efficiently escape to the heat dissipation member 14 via the light reflection member 16, whereby heat generated during light emission in the organic EL element 4 can be efficiently transferred to the outside.

Note that the light reflection member 16 is preferably a metal plate made of a metal, such as aluminum, silver, or an alloy thereof, etc. With such a configuration, the light L which is reflected by the interface between the support base 50 and the outside and is then extracted through the side surface 4a of the organic EL element 4 toward the light reflection member 16, can be efficiently reflected, whereby a large amount of light can be extracted through the light extraction side. Heat generated in the organic EL element 4 as a heat source can more efficiently escape to the heat dissipation member 14 via the light reflection member 16, whereby heat generated during light emission in the organic EL element 4 can be more efficiently transferred to the outside. In order to improve the illuminance of the organic EL illumination device 1, it is preferable that the reflectance of the light reflection member 16 be 60% or more, and the lateral side portion 16a of the light reflection member 16 be arranged so that the incident angle of the light L extracted through the side surface 4a of the organic EL element 4 toward the light reflection member 16 (i.e., an angle $\theta$ of FIG. 6) is $0° < \theta < 90°$.

In other words, with such a configuration, the number of times of reflection of the emitted light L can be reduced, whereby the light L emitted from the organic EL element can used without less attenuation.

Note that the term "reflectance" as used herein refers to a relative value of the reflectance of light having a wavelength of 550 nm which is obtained when a total reflection measurement is performed using the measuring method B described in BS K7105 under the incidence condition of 8°, assuming that the light reflectance which is obtained when a barium sulfate plate is used as a standard reflection plate is 100, where these measurements are performed at a room temperature of 20° C. and a relative humidity of 60%.

Examples of the light reflection member 16 include a white painted plate, an aluminum specular surface, a silver-deposited reflection plate, and a mirror-finished plate made of silicon or titanium etc. which have the above reflectance. In order to increase the reflection efficiency, the reflectance of the light reflection member 16 is more preferably 85% or more, even more preferably 90% or more.

In order to increase the luminous flux of the organic EL illumination device 1, it is preferable that $45° < \theta < 90°$. In order to extract the light L emitted through the side surface of the organic EL element 4 in a direction perpendicular to the light extraction side, it is preferable that $\theta = 45°$.

Thus, in this embodiment, by providing the light reflection member 16, both the light extraction efficiency and the heat dissipation efficiency can be improved even when the heat dissipation member 14 is not transparent.

In the method for manufacturing the organic EL illumination device 1 of this embodiment, in the testing step described in the first embodiment, the organic EL elements 4 are arranged on the element substrate 30 and are spaced apart from each other by the predetermined spacing T, and thereafter, the light reflection members 16 are provided to cover the respective organic EL elements 4 with the lateral side portions 16a of the light reflection members 16 facing the respective corresponding side surfaces 4a of the organic EL elements 4. Next, an insulating resin containing a heat conductive material is provided to cover the light reflection members 16 and fill a space between each organic EL element 4. As a result, the heat dissipation member 14 is formed between each organic EL element 4. Thus, the light reflection member 16 is provided between the organic EL element 4 and the heat dissipation member 14, so that the light reflection member 16 contacts both the organic EL element 4 and the heat dissipation member 14. Note that the other steps are similar to those of the first embodiment.

According to this embodiment described above, the following advantages can be obtained in addition to the advantages (1)-(7) described above.

(8) In this embodiment, the light reflection members 16 are provided to face the side surfaces 4a of the respective organic EL elements 4. Therefore, the light L extracted through the side surface 4a of the organic EL element 4 to the light reflection member 16 can be effectively used, whereby the light extraction efficiency is improved. As a result, the organic EL illumination device 1 which has low power consumption can be provided.

(9) In this embodiment, the light reflection member 16 is provided between the organic EL element 4 and the heat dissipation member 14 so that the light reflection member 16 contacts both the organic EL element 4 and the heat dissipation member 14. Therefore, although the light reflection member 16 is provided, heat generated during light emission in the organic EL element 4 can be efficiently transferred to the outside. As a result, heat during light emission can easily escape to the outside, whereby accumulation of heat in the organic EL element 4 can be reduced or prevented, and therefore, damage to the organic layer 11 can be reduced or prevented.

(10) In this embodiment, the reflectance of the light reflection member 16 is set to 60% or more. The light reflection member 16 is arranged so that the incident angle to the light reflection member 16 of the light L extracted from the organic EL element 4 toward the light reflection member 16 is $0° < \theta < 90°$. Therefore, light emitted at a facet of the substrate can be extracted to the outside without a significant decrease in emission efficiency.

(11) In this embodiment, the light reflection member 16 is formed of a metal. Therefore, the light L extracted through the side surface 4a of the organic EL element 4 toward the light reflection member 16 can be efficiently reflected, whereby a larger amount of light can be extracted through the light extraction side, and as a result, the extraction efficiency can be further improved. Also, heat generated during light emission in the organic EL element 4 can be more efficiently transferred to the outside. As a result, heat during light emission can more easily escape to the outside, whereby accumulation of heat in the organic EL element 4 can be reduced or prevented, and therefore, damage to the organic layer 11 can be reliably reduced or prevented.

(Third Embodiment)

Figure 7:
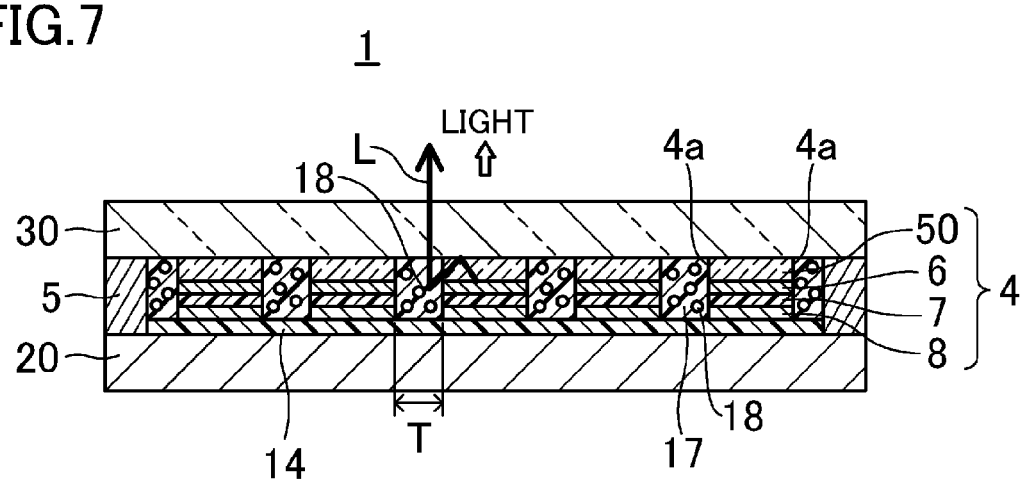
FIG. 7 is a cross-sectional view of an organic EL illumination device according to a third embodiment of the present invention.

Next, a third embodiment of the present invention will be described. FIG. 7 is a cross-sectional view of an organic EL illumination device according to a third embodiment of the present invention. Note that parts similar to those of the first embodiment are indicated by the same reference characters and will not be described. The entire structure of the organic EL illumination device and a method for manufacturing the organic EL illumination device are similar to those described in the first embodiment and will not be here described in detail.

In this embodiment, as shown in FIG. 7, a light diffusion member 17 is provided between each organic EL element 4.

More specifically, as shown in FIG. 7, the light diffusion members 17 are each provided between the corresponding organic EL elements 4 so that the light diffusion members 17 contact the side surfaces 4a of the organic EL elements 4.

Note that, in this embodiment, as shown in FIG. 7, the heat dissipation member 14 is provided in a space formed by a pair of substrates, i.e, the element substrate 30 and the covering substrate 20, to cover surfaces of the organic EL elements 4 and surfaces of the light diffusion members 17.

The light diffusion member 17 contains a transparent resin as a major component. As shown in FIG. 7, the light diffusion member 17 contains transparent particles 18 for diffusing light emitted from the organic layer 7 of the organic EL element 4.

The transparent particles 18 are dispersed in the transparent resin which is a major component of the light diffusion member 17, and have a refractive index different from that of the transparent resin.

As shown in FIG. 7, in the organic EL illumination device 1 of this embodiment, the light diffusion member 17 containing the transparent particles 18 is provided between each organic EL element 4.

With such a configuration, as shown in FIG. 7, light L which is emitted from the organic EL element 4, is then reflected by an interface between the support base 50 and the outside, and is then extracted through the side surface 4a of the organic EL element 4 to the light diffusion member 17, is diffused (reflected) by the transparent particles 18, whereby the light L can be extracted through the light extraction side. Therefore, the light L extracted through the side surface 4a of the organic EL element 4 to the light diffusion member 17 can be effectively used, whereby the light extraction efficiency is improved. As a result, the organic EL illumination device 1 which has low power consumption can be provided.

In this embodiment, the light L extracted through the side surface 4a of the organic EL element 4 to the light diffusion member 17 needs to be extracted through the light extraction side to the outside. Therefore, as described above, the resin which is a major component of the light diffusion member 17 is a transparent resin, so that the light diffusion member 17 is transparent.

Examples of the transparent resin include polyester resins, polyimide resins, acrylic resins, polycarbonate resins, etc. Examples of the transparent particle 18 include inorganic particles, such as glass fiber, glass beads, talc, silica, alumina, magnesia, hydrozincite, calcium carbonate, barium sulfate, titanium white, aluminum hydroxide, mica, feldspar powder, quartz powder, etc., and organic particles, such as silicone resins, fluorine resins, epoxy resins, styrene cross-linked resins, etc. These materials may be used singly or in combination of two or more thereof. The transparent particle 18 preferably has an average particle size of 0.2-10 μm, more preferably 0.2-5 μm.

The transparent particle 18 needs to have a refractive index different from that of the insulating resin, whereby the light diffusion member 17 can satisfactorily scatter light.

Thus, in this embodiment, similar to the second embodiment, the light diffusion member 17 can improve both the light extraction efficiency and the heat dissipation efficiency even when the heat dissipation member 14 is not transparent.

In a method for manufacturing the organic EL illumination device 1 of this embodiment, in the testing step described in the first embodiment, the organic EL elements 4 are arranged on the element substrate 30 and are spaced apart from each other by the predetermined spacing T, and thereafter, the transparent resin containing the transparent particles 18 is provided to fill a space between each organic EL element 4, thereby forming the light diffusion member 17 between each organic EL element 4. Next, an insulating resin containing a heat conductive material is provided to cover surfaces of the organic EL elements 4 and surfaces of the light diffusion members 17, thereby forming the heat dissipation member 14. Note that the other steps are similar to those of the first embodiment.

According to this embodiment described above, the following advantage can be obtained in addition to the advantages (1)-(7) described above.

(12) In this embodiment, the light diffusion member 17 made of a transparent resin and the transparent particles 18 dispersed in the transparent resin is provided between each organic EL element 4. The transparent particle 18 has a refractive index different from that of the transparent resin. Therefore, the light L extracted through the side surface 4a of the organic EL element 4 to the light diffusion member 17 can be effectively used, whereby the light extraction efficiency is improved. As a result, the organic EL illumination device 1 which has low power consumption can be provided.

(Fourth Embodiment)

Figure 8:
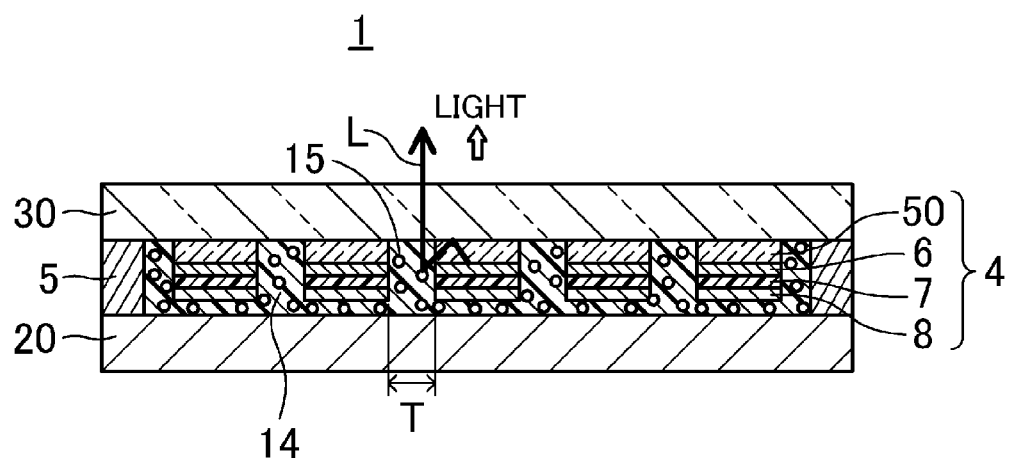
FIG. 8 is a cross-sectional view of an organic EL illumination device according to a fourth embodiment of the present invention.

Next, a fourth embodiment of the present invention will be described. FIG. 8 is a cross-sectional view of an organic EL illumination device according to a fourth embodiment of the present invention. Note that parts similar to those of the first embodiment are indicated by the same reference characters and will not be described. The entire structure of the organic EL illumination device and a method for manufacturing the organic EL illumination device are similar to those described in the first embodiment and will not be here described in detail.

In this embodiment, as shown in FIG. 8, the heat dissipation member 14 contains transparent particles 15 for diffusing light emitted from the organic layer 7 of the organic EL element 4.

The transparent particles 15 are dispersed in an insulating resin which is a major component of the heat dissipation member 14, and have a refractive index different from that of the insulating resin. In other words, in this embodiment, the heat dissipation member 14 is formed of the heat conductive material and the insulating resin containing the transparent particles 15.

In the organic EL illumination device 1 of this embodiment, as shown in FIG. 8, the heat dissipation member 14 containing the transparent particles 15 is provided between each organic EL element 4 and covers surfaces of the organic EL elements 4.

With such a configuration, as shown in FIG. 8, light L which is emitted from the organic EL element 4, is then reflected by an interface between the support base 50 and the outside, and is then extracted through the side surface 4a of the organic EL element 4 to the heat dissipation member 14, is diffused (reflected) by the transparent particles 15, whereby the light L can be extracted through the light extraction side to the outside. Therefore, the light L extracted through the side surface 4a of the organic EL element 4 to the heat dissipation member 14 can be effectively used, whereby the light extraction efficiency is improved. As a result, the organic EL illumination device 1 which has low power consumption can be provided.

In this embodiment, the light L extracted through the side surface 4a of the organic EL element 4 to the heat dissipation member 14 needs to be extracted through the light extraction side to the outside. Therefore, the insulating resin which is a major component of the heat dissipation member 14 is a transparent resin, so that the heat dissipation member 14 is transparent.

The transparent particle 15 needs to have a refractive index different from that of the insulating resin, whereby the heat dissipation member 14 can satisfactorily scatter light.

The transparent particle 15 may be similar to the transparent particle 18 described in the third embodiment. Alumina and magnesia are transparent and have a high thermal conductivity. Therefore, if the transparent particle 15 is made of alumina or magnesia, the transparent particle 15 can also serve as a heat conductive material.

In a method for manufacturing the organic EL illumination device 1 of this embodiment, in the heat dissipation member formation step described in the first embodiment, the organic EL elements 4 are fixed to the element substrate 30, and thereafter, an insulating resin containing a heat conductive material and the transparent particles 15 is provided to fill a space between each organic EL element 4, thereby forming the heat dissipation member 14 between each organic EL element 4. Note that the other steps are similar to those of the first embodiment.

According to this embodiment described above, the following advantage can be obtained in addition to the advantages (1)-(7) described above.

(13) In this embodiment, the insulating resin which is a major component of the heat dissipation member 14 is a transparent resin. The heat dissipation member 14 contains the transparent particles 15 which are dispersed in the insulating resin and have a refractive index different from that of the insulating resin. Therefore, the light L which is emitted from the organic EL element 4, is then reflected by an interface between the support base 50 and the outside, and is then extracted through the side surface 4a of the organic EL element 4 to the heat dissipation member 14, is diffused (reflected) by the transparent particles 15, and therefore, can be extracted through the light extraction side to the outside. Therefore, the light L extracted through the side surface 4a of the organic EL element 4 to the heat dissipation member 14 can be effectively used, whereby the light extraction efficiency is improved. As a result, the organic EL illumination device 1 which has low power consumption can be provided.

Note that the above embodiments may be modified as follows.

In the embodiments, the hole injection layer 9, the hole transport layer 10, the emitting layer 11, the electron transport layer 12, and the electron injection layer 13 are successively stacked together to form the organic layer 7. The structure of the organic layer 7 of the present invention is not limited to this. For example, in the organic layer 7, the hole injection layer 9 and the electron injection layer 13 may be removed, and the hole transport layer 10, the emitting layer 11, and the electron transport layer 12 may be successively stacked together to form an organic layer having a three-layer structure. An electron blocking layer may be provided between the hole transport layer 10 and the emitting layer 11, and a hole blocking layer may be provided between the emitting layer 11 and the electron transport layer 12. Thus, the hole injection layer 9, the hole transport layer 10, the electron blocking layer, the emitting layer 11, the hole blocking layer, the electron transport layer 12, and the electron injection layer 13 may be successively stacked together to form an organic layer having a seven-layer structure.

The electron blocking layer has a function of blocking movement of electrons to the anode. A material for blocking electrons is, for example, 4,4'-bis-[N,N'-(3-tolyl)amino-3,3'-dimethylbiphenyl (HMTPD) represented by:

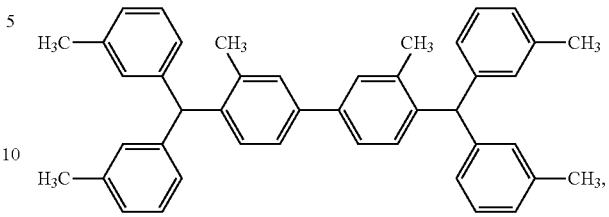

ete. The electron blocking layer has a thickness of, for example, about 10 nm

The hole blocking layer has a function of blocking movement of holes to the cathode. A material for blocking holes is, for example, 2,9-dimethyl-4,7-diphenyl-1,10-phenanthroline (BCP) represented by:

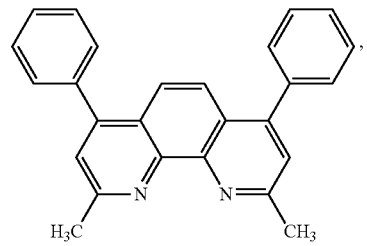 [SMILES: Cc1cc(-c2ccccc2)c2ccc3c(-c4ccccc4)cc(C)nc3c2n1 ; ","]

etc. The hole blocking layer has a thickness of, for example, about 10 nm.

The electron blocking layer and the hole blocking layer can be formed by roll-to-roll processing in which the deposition rates are controlled, similar to the first electrode 6, the organic layer 7, and the second electrode 8.

In the organic layer 7, a plurality of emitting layers 11 may be provided, and a charge generation layer may be provided between each emitting layer 11.

The charge generation layer has a function of injecting holes from one main surface and electrons from the other main surface while maintaining the organic layer 7 substantially at a uniform potential when electric charge is applied. The charge generation layer may be conductive, semi-conductive like a doped organic layer, or electrically insulating.

A material for generating electric charge may have one surface through which holes can be injected and the other surface through which electrons can be injected. Examples of the electric charge generation material include: a thin film metal, such as Mg, Ag, Al, Mg:Ag alloy, Mg:Al alloy, Al:Li alloy, etc.; a transparent electrode, such as ITO, IZO, etc.; a mixture layer containing an electron transport compound, such as an oxine metal complex, a heterocyclic compound, etc., and an electron injection compound containing an alkali metal, an alkaline earth metal, a rare-earth metal, and a compound containing these, etc.; a hole conductive organic layer made of a hole transport material, such as 2-TNATA, NPD, etc., doped with an electron withdrawing oxidizer, such as TCNQ, $FeCl_3$, etc., a p-type conductive polymer, a p-type semiconductor, etc.; a p-type semiconductor (e.g., p-type α-Si, p-type Si, p-type CdTe, p-type CuO, etc.), an n-type semiconductor (e.g., n-type α-Si, n-type Si, n-type CdS, n-type ZnS, etc.), and polyarylene vinylene, polythienylene vinylene, etc., which are p-type or n-type conductive polymers containing a combination of p-type and n-type semiconductors; etc.

The charge generation layer can be formed by roll-to-roll processing in which the deposition rate is controlled, similar to the first electrode 6, the organic layer 7, and the second electrode 8.

Figure 9:
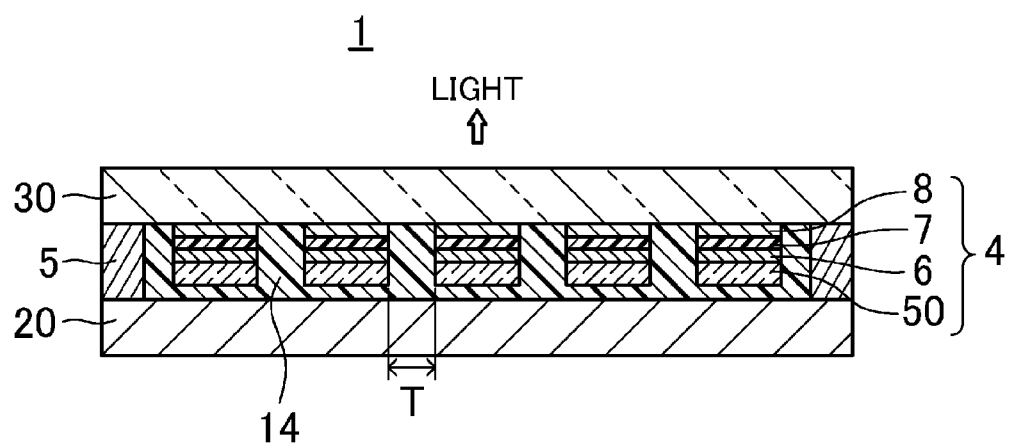
FIG. 9 is a cross-sectional view showing a variation of the organic EL illumination device of the present invention.

In the above embodiments, as shown in FIG. 2, the organic EL element 4 is provided on the element substrate 30 with the support base 50 facing or contacting the element substrate 30. Alternatively, as shown in FIG. 9, the organic EL element 4 may be provided on the element substrate 30 with the second electrode 8 facing or contacting the element substrate 30. With such a configuration, an area where the second electrode 8 contacts the heat dissipation member 14 can be reduced, and therefore, the contact of the second electrode 8 with moisture contained in the resin included in the heat dissipation member 14 can be effectively reduced, whereby a drawback, such as delamination of the organic layer 7 and the second electrode 8 due to moisture, etc, can be effectively reduced.

EXAMPLES

First Example

An organic EL illumination device according to the first embodiment was fabricated.

As the support base, a PET film having a width of 20 mm and a length of 10 m was used. Initially, the PET film was attached to a roll-to-roll vapor deposition device. Thereafter, the PET film was passed through the roll at a constant speed of 1 m/sec to form an ITO film as the first electrode on a surface of the PET film. Next, the PET film was subjected to ultrasonic cleaning for 10 min, and then to UV ozone cleaning for 30 min, using acetone or isopropyl alcohol. Next, the roll-to-roll vapor deposition device was used to form the organic layer, the second electrode, and the protection film.

The organic layer was formed as follows. Initially, a hole injection layer (thickness: 30 nm) made of copper phthalocyanine (CuPc) was formed on a surface of the first electrode by a vacuum vapor deposition process. Next, a hole transport layer (thickness: 20 nm) made of 4,4'-bis[N-(1-naphthyl)-N-phenyl-amino]biphenyl] (α-NPD) was formed on the hole injection layer. Next, an electron blocking layer (thickness: 10 nm) made of 4,4'-bis-[N,N'-(3-tolyl)amino-3,3'-dimethyl-biphenyl (HMTPD) was formed on the hole transport layer. Next, a red light emitting layer (thickness: 20 nm) which can transport both positive and negative charges was formed on the electron blocking layer. The red light emitting layer which can transport both positive and negative charges was formed by co-evaporation of α-NPD (hole transport material), 3-phenyl-4(1'-naphthyl)-5-phenyl-1,2,4-triazole (TAZ) (electron transport material), and bis(2-(2'-benzo[4,5-a]thienyl)-pyridinato-N,C3')iridium(acetylacetonate) ((btp)$_2$Ir(acac)) (red light emission dopant), where the ratio of their deposition rates was controlled to 0.6:1.4:0.15. Next, a green light emitting layer (thickness: 20 nm) which can transport both positive and negative electric charges was formed on the red light emitting layer which can transport both positive and negative electric charges. The green light emitting layer which can transport both positive and negative electric charges was formed by co-evaporation of α-NPD (hole transport material), TAZ (electron transport material), Ir(ppy)$_3$ (green light emission dopant), where the ratio of their deposition rates was controlled to 1.0:1.0:0.1. Next, a blue light emitting layer (thickness: 10 nm) which can transport both positive and negative electric charges was formed on the green light emitting layer which can transport both positive and negative electric charges. The light emitting layer which can transport both positive and negative electric charges was formed by co-evaporation of α-NPD (hole transport material), TAZ (electron transport material), and 2-(4'-t-butyl phenyl)-5-(4"-biphenyl-yl)-1,3,4-oxadiazole (t-Bu PBD) (blue light emission dopant), where the ratio of their deposition rates was controlled to 1.5:0.5:0.2. As a result, a white light emitting layer was obtained.

Next, a hole blocking layer (thickness: 10 nm) made of 2,9-dimethyl-4,7-diphenyl-1,10-phenanthroline (BCP) was formed on the emitting layer. Next, an electron transport layer hole (thickness: 30 nm) made of tris(8-quinolinyloxy) aluminum (Alq3) was formed on the hole blocking layer.

Next, an electron injection layer (thickness: 1 nm) made of lithium fluoride (LiF) was formed on the electron transport layer. Next, aluminum (thickness: 300 nm) was similarly deposited on a surface of the electron injection layer by a vacuum vapor deposition process. As a result, an upper electrode (cathode) was formed. Next, a protection film (thickness: 100 nm) made of SiON was formed on the aluminum electrode by an ion implanting process. The resulting film was wound again into a roll. Thus, the organic EL element was fabricated.

Next, the fabricated organic EL element was cut into six pieces each having a length of 15 cm, which were then fixed to a glass substrate, where the six pieces were spaced apart from each other by 5 mm. Next, the anode and cathode of each of the six organic EL elements were electrically connected to extraction terminals provided on the glass substrate so that the six organic EL elements were electrically connected in parallel. Next, F-CO™ sheet manufactured by FURUKAWA ELECTRIC CO. LTD. as the heat dissipation member was provided on three sides other than the light extraction side of each of the six organic EL elements. Thereafter, a metal covering substrate was fixed to the glass substrate having the organic EL elements using a UV curable resin. Thus, the organic EL illumination device was fabricated.

When a voltage of 10 V was applied to the organic EL illumination device including the six organic EL elements, white light of 6000 cd/m$^2$ was obtained. After 10 min of light emission at 6000 cd/m$^2$, the measured temperature of the organic EL element was 30° C.

Second Example

An organic EL element which was fabricated by the process described in the first example was cut into six pieces each having a length of 15 cm, which were then fixed to a glass substrate, where the six pieces were spaced apart from each other by 5 mm. Next, the anode and cathode of each of the six organic EL elements were electrically connected to extraction terminals provided on the glass substrate so that the six organic EL elements were electrically connected in parallel. Next, a trapezoidal structure made of aluminum was provided to surround portions other than the light extraction side of each of the six organic EL elements, where the trapezoidal structure has a sloped side having an angle of 45° relative to a facet of the organic EL element. Thereafter, F-CO™ sheet manufactured by FURUKAWA ELECTRIC CO. LTD. as the heat dissipation member was provided between the trapezoidal structure and the glass substrate. A metal covering substrate was fixed to the glass substrate having the organic EL elements using a UV curable resin. Thus, the organic EL illumination device was fabricated.

When a voltage of 10 V was applied to the organic EL illumination device including the six organic EL elements, white light of 7600 cd/m$^2$ was obtained. After 10 min of light emission at 7600 cd/m², the measured temperature of the organic EL element was 32° C.

First Comparative Example

An organic EL illumination device was fabricated in a manner which is similar to the first example, except that the heat dissipation member was not formed. When a voltage of 10 V was applied to the fabricated organic EL illumination device, white light of 6000 cd/m² was obtained. After 10 min of light emission at 6000 cd/m², the measured temperature of the organic EL element was 43° C.

INDUSTRIAL APPLICABILITY

The present invention is useful for an organic EL illumination device including an organic EL element and a method for manufacturing the organic EL illumination device.

DESCRIPTION OF REFERENCE CHARACTERS

1 ORGANIC EL ILLUMINATION DEVICE
4 ORGANIC EL ELEMENT
5 SEALING MEMBER
6 FIRST ELECTRODE
7 ORGANIC LAYER
8 SECOND ELECTRODE
14 HEAT DISSIPATION MEMBER
15 TRANSPARENT PARTICLE
16 LIGHT REFLECTION MEMBER
17 LIGHT DIFFUSION MEMBER
18 TRANSPARENT PARTICLE
20 COVERING SUBSTRATE
25 ROLL-TO-ROLL VAPOR DEPOSITION DEVICE
30 ELEMENT SUBSTRATE
50 SUPPORT BASE

The invention claimed is:

1. An organic EL illumination device in which a plurality of organic EL elements are provided between a pair of substrates facing each other, wherein
   a heat dissipation member which covers surfaces of the organic EL elements is provided in a space formed by the pair of substrates,
   each of the organic EL elements is divided into a first electrode, an organic layer, and a second electrode, and
   the heat dissipation member is provided to fill a space between each of the organic elements.

2. The organic EL illumination device of claim 1, wherein the plurality of organic EL elements are spaced apart from each other by a predetermined spacing.

3. The organic EL illumination device of claim 1, wherein the heat dissipation member is formed of an insulating resin containing a heat conductive material.

4. The organic EL illumination device of claim 1, wherein one of the pair of substrates which is located on a light extraction side is made of an optically transparent material, and the other substrate which is located on a side opposite to the light extraction side is a substrate on which a metal film is formed or a metal substrate.

5. The organic EL illumination device of claim 1, wherein a light reflection member is provided to face a side surface of each of the plurality of organic EL elements.

6. The organic EL illumination device of claim 5, wherein the light reflection member is provided between the organic EL element and the heat dissipation member, and the light reflection member contacts both the organic EL element and the heat dissipation member.

7. The organic EL illumination device of claim 6, wherein the light reflection member is formed of a metal.

8. The organic EL illumination device of claim 5, wherein the light reflection member has a reflectance of 60% or more, and is arranged so that the incident angle to the light reflection member of light extracted from the organic EL element toward the light reflection member is $0° < \theta < 90°$.

9. The organic EL illumination device of claim 1, wherein a light diffusion member including a transparent resin and transparent particles dispersed in the transparent resin is provided between each of the plurality of organic EL elements, and the transparent particle has a refractive index different from that of the transparent resin.

10. The organic EL illumination device of claim 1, wherein the heat dissipation member is formed of a transparent insulating resin, and the heat dissipation member contains transparent particles dispersed in the insulating resin and having a refractive index different from that of the insulating resin.

11. The organic EL illumination device of claim 1, wherein the plurality of organic EL elements include an emitting layer which emits a plurality of light beams having different colors.

12. A method for manufacturing an organic EL illumination device, comprising the steps of:
   forming an organic EL element by successively stacking a first electrode, an organic layer, and a second electrode together on a support base;
   arranging a plurality of the organic EL elements on a first substrate so that the plurality of organic EL elements are spaced apart from each other by a predetermined spacing;
   forming a heat dissipation member between each of the plurality of organic EL elements by filling a space between each of the plurality of organic EL elements with an insulating resin containing a heat conductive material; and
   arranging the plurality of organic EL elements between the first and second substrates by putting the second substrate on the first substrate so that the plurality of organic EL elements are covered by the second substrate, wherein each of the organic EL elements is divided into a first electrode, an organic layer, and a second electrode.

13. The method of claim 12, wherein the step of forming the organic EL element is performed on the support base conveyed in roll-to-roll processing.

14. A method for manufacturing an organic EL illumination device, comprising the steps of:
   forming an organic EL element by successively stacking a first electrode, an organic layer, and a second electrode together on a support base;
   arranging a plurality of the organic EL elements on a first substrate so that the plurality of organic EL elements are spaced apart from each other by a predetermined spacing;
   providing a light reflection member facing a side surface of each of the plurality of organic EL elements;
   forming a heat dissipation member between each of the plurality of organic EL elements by filling a space between each of the plurality of organic EL elements with an insulating resin containing a heat conductive material; and
   arranging the plurality of organic EL elements between the first and second substrates by putting the second substrate on the first substrate so that the plurality of organic EL elements are covered by the second substrate, wherein each of the organic EL elements is divided into a first electrode, an organic layer, and a second electrode.

15. A method for manufacturing an organic EL illumination device, comprising the steps of:

forming an organic EL element by successively stacking a first electrode, an organic layer, and a second electrode together on a support base;

arranging a plurality of the organic EL elements on a first substrate so that the plurality of organic EL elements are spaced apart from each other by a predetermined spacing;

providing a light diffusion member between each of the plurality of organic EL elements by filling a space between each of the plurality of organic EL elements with a transparent resin containing transparent particles;

forming a heat dissipation member by providing an insulating resin containing a heat conductive material so that the plurality of organic EL elements and the light diffusion member are covered with the insulating resin; and arranging the plurality of organic EL elements between the first and second substrates by putting the second substrate on the first substrate so that the plurality of organic EL elements are covered by the second substrate, wherein each of the organic EL elements is divided into a first electrode, an organic layer, and a second electrode.

* * * * *